(12) United States Patent
Moon

(10) Patent No.: US 8,450,719 B2
(45) Date of Patent: May 28, 2013

(54) NITRIDE-BASED LIGHT EMITTING DEVICE

(75) Inventor: Yong Tae Moon, Seoul (KR)

(73) Assignees: LG Innotek, Co. Ltd., Seoul (KR); LG Electronics, Inc., Seoul (KR)

( * ) Notice: Subject to any disclaimer, the term of this patent is extended or adjusted under 35 U.S.C. 154(b) by 0 days.

(21) Appl. No.: 13/116,802

(22) Filed: May 26, 2011

(65) Prior Publication Data

US 2011/0227039 A1    Sep. 22, 2011

Related U.S. Application Data

(63) Continuation of application No. 11/878,642, filed on Jul. 25, 2007, now Pat. No. 7,977,665.

(30) Foreign Application Priority Data

Jul. 26, 2006  (KR) .................. 10-2006-0070212
Jun. 7, 2007   (KR) .................. 10-2007-0055360

(51) Int. Cl.
*H01L 29/06* (2006.01)
(52) U.S. Cl.
USPC ........... 257/14; 257/94; 257/96; 257/E33.008
(58) Field of Classification Search
USPC .................. 257/14, 94, 96, E33.008
See application file for complete search history.

(56) References Cited

U.S. PATENT DOCUMENTS

| | | | |
|---|---|---|---|
| 5,021,360 | A | 6/1991 | Melman et al. |
| 5,877,519 | A | 3/1999 | Jewell |
| 6,597,017 | B1 | 7/2003 | Seko et al. |
| 6,803,597 | B2 | 10/2004 | Watatani |
| 2001/0030317 | A1 | 10/2001 | Lee et al. |
| 2004/0256611 | A1* | 12/2004 | Kim et al. ............... 257/13 |
| 2006/0126688 | A1* | 6/2006 | Kneissl ............... 372/43.01 |
| 2006/0192195 | A1 | 8/2006 | Lee |
| 2009/0045393 | A1 | 2/2009 | Nakahara |

FOREIGN PATENT DOCUMENTS

| | | |
|---|---|---|
| DE | 199 55 747 | 5/2001 |
| DE | 102 28 910 | 1/2003 |
| JP | 2006-313845 A | 11/2006 |
| KR | 10-2000-0065567 | 11/2000 |
| KR | 10-2004-0047132 | 6/2004 |
| KR | 10-2006-0019043 | 3/2006 |
| KR | 10-2006-0044241 A | 5/2006 |
| WO | WO 2006/022497 | 3/2006 |

* cited by examiner

*Primary Examiner* — Ken Parker
*Assistant Examiner* — Dale E Page
(74) *Attorney, Agent, or Firm* — McKenna Long & Aldridge, LLP

(57) ABSTRACT

A nitride-based light emitting device capable of achieving an enhancement in light emission efficiency and an enhancement in reliability is disclosed. The nitride-based light emitting device includes a light emitting layer including a quantum well layer and a quantum barrier layer, and a stress accommodating layer arranged on at least one surface of the quantum well layer of the light emitting layer.

23 Claims, 15 Drawing Sheets

US 8,450,719 B2

NITRIDE-BASED LIGHT EMITTING DEVICE

This application is a continuation application Ser. No. 11/878,642 filed Jul. 25, 2007, currently allowed which claims the benefit of Korean Patent Application No. 10-2006-0070212, filed on Jul. 26, 2006 and Korean Patent Application No. 10-2007-0055360, filed on Jun. 7, 2007, which are hereby incorporated by reference as if fully set forth herein.

BACKGROUND OF THE INVENTION

1. Field of the Invention

The present invention relates to a nitride-based light emitting device, and more particularly to a nitride-based light emitting device capable of achieving an enhancement in light emission efficiency and an enhancement in reliability.

2. Discussion of the Related Art

Light emitting diodes (LEDs) are well known as a semiconductor light emitting device which converts current to light, to emit light. Since a red LED using GaAsP compound semiconductors was made commercially available in 1962, it has been used, together with a GaP:N-based green LED, as a light source in electronic apparatuses, for image display.

The wavelength of light emitted from such an LED depends on the semiconductor material used to fabricate the LED. This is because the wavelength of the emitted light depends on the band-gap of the semiconductor material representing energy difference between valence-band electrons and conduction-band electrons.

A gallium nitride (GaN) compound semiconductor has been highlighted in the field of high-power electronic devices including light emitting diodes (LEDs) because it exhibits a high thermal stability and a wide band-gap of 0.8 to 6.2 eV.

One of the reasons why the GaN compound semiconductor has been highlighted is that it is possible to fabricate semiconductor layers capable of emitting green, blue, and white light, using GaN in combination with other elements, for example, indium (In), aluminum (Al), etc.

Thus, it is possible to adjust the wavelength of light to be emitted, in accordance with the characteristics of a specific apparatus, using GaN in combination with other appropriate elements. For example, it is possible to fabricate a blue LED useful for optical recording or a white LED capable of replacing a glow lamp.

By virtue of the above-mentioned advantages of the GaN-based material, techniques associated with GaN-based electro-optic devices have rapidly developed since the GaN-based LEDs became commercially available in 1994.

The brightness or output of an LED manufactured using the above-mentioned GaN-based material mainly depends on the structure of an active layer, the extraction efficiency associated with external extraction of light, the size of the LED chip, the kind and angle of a mold used to assemble a lamp package, the fluorescent material used, etc.

Meanwhile, the reason why it is difficult to grow such a GaN-based semiconductor, as compared to other III-V ground compound semiconductors is that, for example, there is no high-quality substrate such as a wafer made of GaN, InN, AlN, or the like.

For this reason, although the LED structure is grown over a substrate made of a material different from that of the above-mentioned substrate, for example, sapphire, a large amount of defects are generated in this case. Such defects have severe influence on the performance of the LED.

In particular, the active layer, which functions to emit light in the LED structure, has a nitride semiconductor multi-quantum well (MQW) structure. Such an MQW structure includes quantum well layers and quantum barrier layers alternately deposited in a repeated manner. In accordance with this structure, electrons and holes respectively injected from an n-type semiconductor layer and a p-type semiconductor layer are coupled in the quantum well layers, thereby emitting light.

The quantum well layers and quantum barrier layers constituting the above-mentioned MQW structure contain different materials. As a result, stress may be applied to the quantum well layers due to such a material difference.

SUMMARY OF THE INVENTION

Accordingly, the present invention is directed to a nitride-based light emitting device that substantially obviates one or more problems due to limitations and disadvantages of the related art.

An object of the present invention is to provide a nitride-based light emitting device capable of adjusting or suppressing the generation of strain and crystal defects while efficiently confining electrons and holes in an active layer, thereby achieving an enhancement in reliability.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a nitride-based light emitting device comprises: a light emitting layer including a quantum well layer and a quantum barrier layer; and a stress accommodating layer arranged on at least one surface of the quantum well layer of the light emitting layer.

In another aspect of the present invention, a nitride-based light emitting device comprises at least one quantum well structure including: a first quantum barrier layer; a stress accommodating layer arranged on the first quantum barrier layer; a second quantum barrier layer arranged on the stress accommodating layer; a quantum well layer arranged on the second quantum barrier layer; and another first quantum barrier layer arranged on the quantum well layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
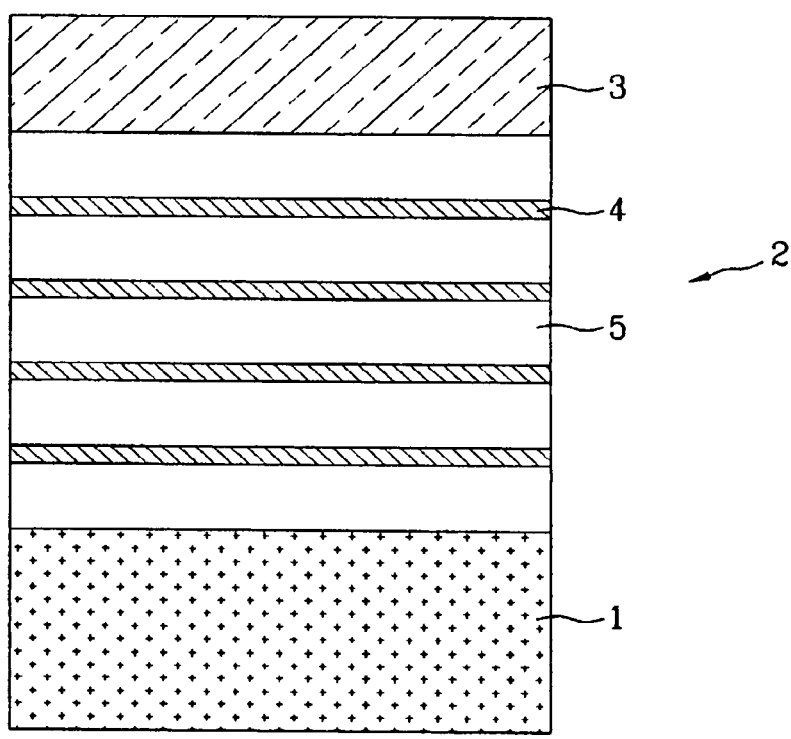
FIG. 1 is a sectional view illustrating a thin film structure of a nitride-based light emitting device.

The present invention now will be described more fully hereinafter with reference to the accompanying figures, in which embodiments of the invention are shown.

This invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element such as a layer, region or substrate is referred to as being "on" another element, it can be directly on the other element or intervening elements may also be present. It will also be understood that if part of an element, such as a surface, is referred to as "inner," it is farther to the outside of the device than other parts of the element.

In addition, relative terms, such as "beneath" and "overlies", may be used herein to describe one layer's or region's relationship to another layer or region as illustrated in the figures.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

FIG. 1 illustrates a basic thin film structure of a nitride semiconductor light emitting device. The nitride semiconductor light emitting device may be a light emitting diode (LED) made of a GaN-based material. As shown in FIG. 1, the basic structure of such an LED includes an n-type electron injection layer 1, a light emitting layer 2, and a p-type hole injection layer 3. The light emitting layer 2 has a quantum well structure, and is interposed between the n-type electron injection layer 1 and the p-type hole injection layer 3.

Generally, the light emitting layer 2, which emits light, has a nitride semiconductor multi-quantum well (MQW) structure.

The MQW structure includes quantum well layers 4 and quantum barrier layers 5 alternately deposited in a repeated manner. In accordance with this MQW structure, electrons and holes respectively injected from the n-type electron injection layer 1 and p-type hole injection layer 3 are coupled in the quantum well, thereby emitting light.

Each quantum well layer 4 can quantum-mechanically confine electrons and holes because it is interposed between two quantum barrier layers 5.

In order to realize a high-brightness light emitting device, it is necessary to smoothly transport electrons and holes to each quantum well layer 4, and to efficiently couple the transported electrons and holes in the quantum well layer 4.

Therefore, the quantum well layers 4 and quantum barrier layers 5 should have superior thin film crystallinity, in order to realize a high-brightness light emitting device.

The most representative MQW structure of current nitride semiconductor light emitting devices includes gallium nitride (GaN) quantum barrier layers having a relatively-high energy band gap, as the quantum barrier layers 5, and indium gallium nitride (InGaN) quantum well layers having a relatively-low energy band gap, as the quantum well layers 4. In this case, the gallium nitride and indium gallium nitride layers are prepared in the form of thin films having a high quality.

Intrinsically, gallium nitride and indium gallium nitride exhibit very-large lattice mismatch. This is because the atom radius of indium is larger than the atom radius of gallium, and the coupling force and coupling length of indium and nitrogen are smaller than and longer than those of gallium and nitrogen, respectively.

For this reason, the InGaN quantum well layers 4 are severely subjected to compressive stress. Such compressive stress changes the energy band structure of each quantum well layer 4, thereby causing electrons and holes in the quantum well layer 4 to be spatially separated from each other. As a result, a degradation in the light emission efficiency of the light emitting device occurs.

In addition, the compressive stress degrades the characteristics of the interface between the adjacent GaN quantum barrier layer 5 and InGaN quantum well layer 4, thereby causing loss of carriers at the interface. As a result, the light emission efficiency of the light emitting device may be degraded.

Therefore, in order to fundamentally overcome the above-described phenomenon, a quantum well structure including a nitride semiconductor stress accommodating layer ($In_xAl_wGa_{1-v-w}N$, $0 \leq v, w \leq 1$, $0 \leq v+w \leq 1$) may be used.

First Embodiment

Figure 2:
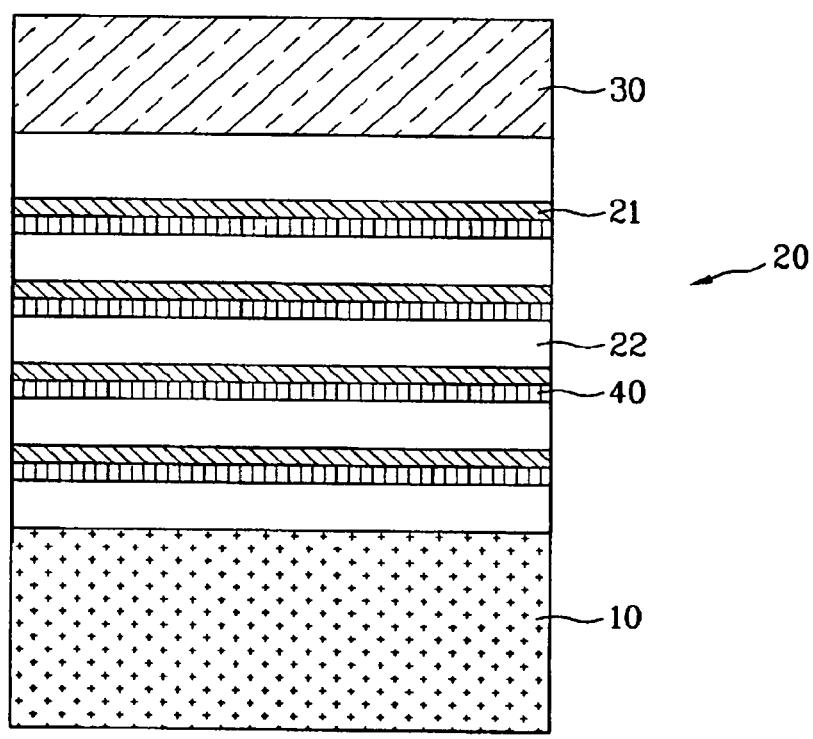
FIG. 2 is a sectional view illustrating a first embodiment of the present invention.

Referring to FIG. 2, a nitride semiconductor light emitting device according to a first embodiment of the present invention is illustrated. As shown in FIG. 2, the nitride semiconductor light emitting device includes an n-type semiconductor layer 10 as an electron injection layer, a light emitting layer 20, and a p-type semiconductor layer 30 as a hole injection layer. The light emitting layer 20, which emits light, has a nitride semiconductor single-quantum well (QW) structure or a nitride semiconductor multi-quantum well (MQW) structure.

The MQW structure includes quantum well layers 21 and quantum barrier layers 22 alternately deposited in a repeated manner. In accordance with this MQW structure, electrons and holes respectively injected from the electron injection layer and hole injection layer are coupled in the quantum well, thereby emitting light.

A stress accommodating layer 40 may be formed on at least one surface of each quantum well layer 21.

That is, the MQW structure includes repeated QW structures deposited over the n-type semiconductor layer 10 in a repeated manner. Each of the repeated QW structures includes one quantum barrier layer 22, one stress accommodating layer 40 deposited over the quantum barrier layer 22, and one quantum well layer 21 deposited over the stress accommodating layer 40.

Referring to the lamination order in each repeated QW structure, the quantum well layer 21 is deposited after the lamination of the stress accommodating layer 40 over the quantum barrier layer 22. Accordingly, the stress accommodating layer 40 can accommodate stress applied to the quantum well layer 21.

For the stress accommodating layer 40, a super-lattice layer including a deposited structure of semiconductor layers having different in-plane lattice constants may be used.

In detail, the super-lattice layer may include two kinds of layers alternately deposited in a repeated manner. One kind of layers have an average in-plane lattice constant higher than the lattice constant of the quantum barrier layer 22, whereas the other kind of layers have an average in-plane lattice constant lower than the lattice constant of the quantum well layer 21.

Figure 3:
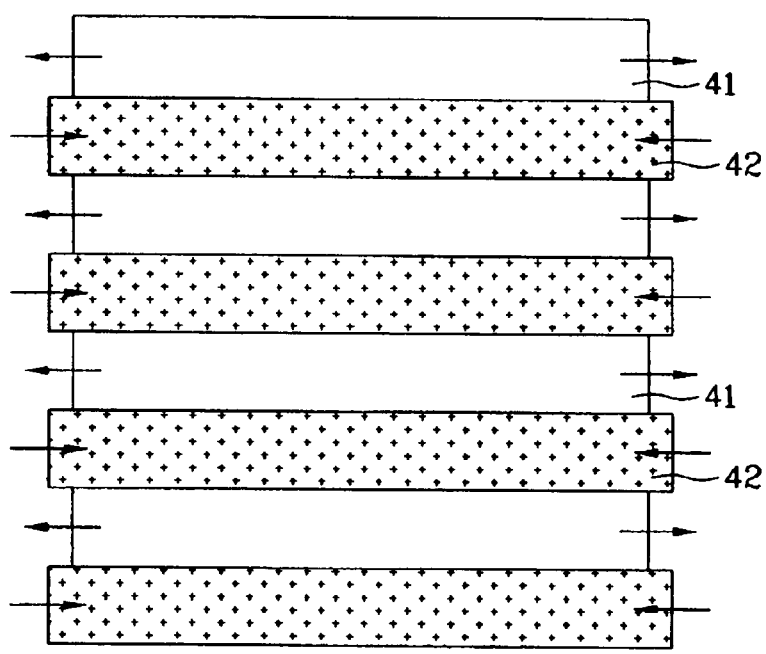
FIG. 3 is a sectional view illustrating a stress accommodating layer constituted by a super-lattice layer.

FIG. 3 illustrates the case in which the stress accommodating layer 40 includes the above-described super-lattice layer. The super-lattice layer includes first layers 41 and second layers 42, which have different lattice constants.

In the case of FIG. 3, the in-plane lattice constant of the second layers 42 is higher than that of the first layers 41. Each first layer 41 is in a state of being subjected to tensile stress, whereas each second layer 42 is in a state of being subjected to compressive stress.

Since the layers 41 and 42 of tensed and compressed states are alternately deposited, the super-lattice layer can effectively function as the stress accommodating layer 40.

Each of the layers 41 and 42 of the super-lattice layer may include 1 to 10 mono-layers. Preferably, each stress accommodating layer 40, which consists of the above-described super-lattice layer, has a thickness of 0.5 to 10 nm.

Alternatively, the super-lattice layer may include 2 to 40 layer pairs each including two layers 41 and 42 having different lattice constants.

An example of the stress accommodating layer 40, which consists of a super-lattice layer having a structure including two kinds of layers alternately deposited in a repeated manner while having different average in-plane lattice constants respectively higher than the lattice constant of the quantum barrier layer 22 and lower than the lattice constant of the quantum well layer 21, may be configured by alternately laminating nitride semiconductor materials (AlInGaN) having different lattice constants and different band gaps.

That is, the stress accommodating layer 40 may include first and second layers 41 and 42 made of AlInGaN materials having different Al and In contents.

Alternatively, each first layer 41 may be made of GaN, whereas each second layer 42 may be made of AlInGaN or InGaN.

Figure 4:
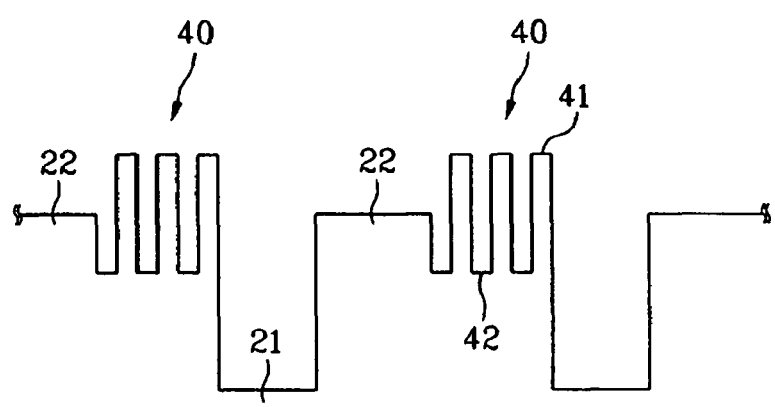
FIG. 4 is an energy band diagram of the first embodiment of the present invention.

FIG. 4 shows an energy band diagram of a configuration in which a stress accommodating layer 40 consisting of a super-lattice layer is arranged on one surface of each quantum well layer 21 (The energy band diagram and following energy band diagrams will show only conduction bands, for the convenience of illustration.).

Referring to FIG. 4, it can be seen that each first layer 41 of the super-lattice layer exhibits an energy band gap higher than that of each quantum barrier layer 22, and each second layer 42 of the super-lattice layer exhibits an energy band gap lower than that of each quantum barrier layer 22 while being larger than that of each quantum well layer 21.

Each quantum barrier layer 22 of the light emitting layer 20 may be made of a material such as GaN, InGaN, or AlInGaN. Each quantum well layer 21 of the light emitting layer 20 may be made of a material such as InGaN or AlInGaN.

Where each quantum well layer 21 is made of InGaN, the associated stress accommodating layer 40 can exhibit a more effective effect when the quantum well layer 21 contains an increased amount of In.

That is, where each quantum well layer 21 is made of InGaN expressed by $In_xGa_{1-x}N$, it is preferred that "x" be 0.2 to 0.4 ($0.2 \leq x \leq 0.4$).

Second Embodiment

Figure 5:
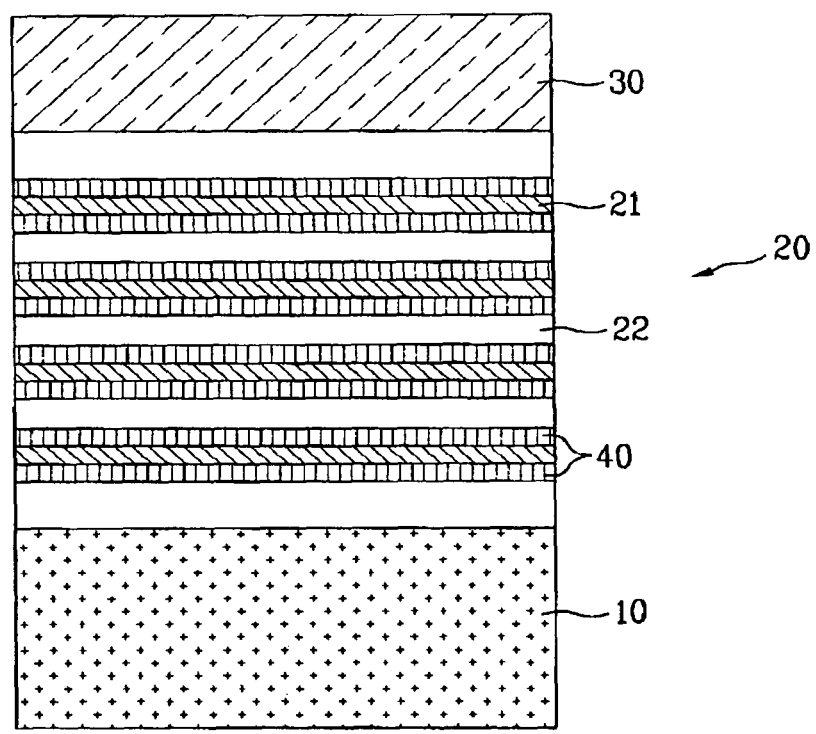
FIG. 5 is a sectional view illustrating a second embodiment of the present invention.

As shown in FIG. 5, each stress accommodating layer 40 may be arranged between the adjacent quantum well layer 21 and quantum barrier layer 22.

That is, in an MQW structure, which includes repeated QW structures deposited over the n-type semiconductor layer 10 in a repeated manner, each of the repeated QW structures includes one quantum barrier layer 22, one stress accommodating layer 40 deposited over the quantum barrier layer 22, one quantum well layer 21 deposited over the stress accommodating layer 40, and another stress accommodating layer 40 deposited over the quantum well layer 21, in accordance with a second embodiment of the present invention.

In this structure, each first layer 41 of the super-lattice layer, which constitutes the stress accommodating layer 40, may have the same band gap as the quantum barrier layer in accordance with the elements of the material constituting the super-lattice layer and the elements of the material constituting the quantum well layer 21.

Figure 6:
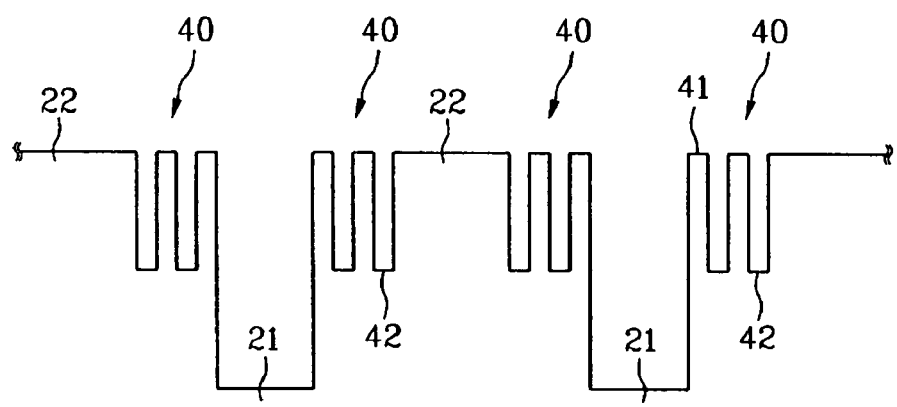
FIG. 6 is an energy band diagram of the second embodiment of the present invention.

FIG. 6 illustrates a structure in which stress accommodating layers 40 each consisting of a super-lattice layer are arranged on opposite surfaces of each quantum well layer 21, respectively.

If necessary, the band gap of each second layer 42 of the super-lattice layer may be lower than the band gap of the quantum well layer 21.

Typically, InGaN containing In exhibits a lattice constant higher than that of GaN, and an energy band gap lower than GaN. Also, AlGaN containing Al exhibits a band gap higher than that of GaN. Accordingly, it is possible to form the stress accommodating layer 40 such that it can accommodate stress applied to the quantum well layer 21, in accordance with an appropriate combination of In and Al.

Each quantum well layer 21 in the above-described quantum well structure can quantum-mechanically confine electrons and holes because it is interposed between two quantum barrier layers 22.

In accordance with the provision of the stress accommodating layers 40 each consisting of the above-described super-lattice layer, it is possible to accommodate stress applied to the light emitting layer 20, and thus to achieve a great increase in light emission efficiency.

Each stress accommodating layer 40 can also function to effectively confine charges in the associated quantum well layer 21.

Figure 7:
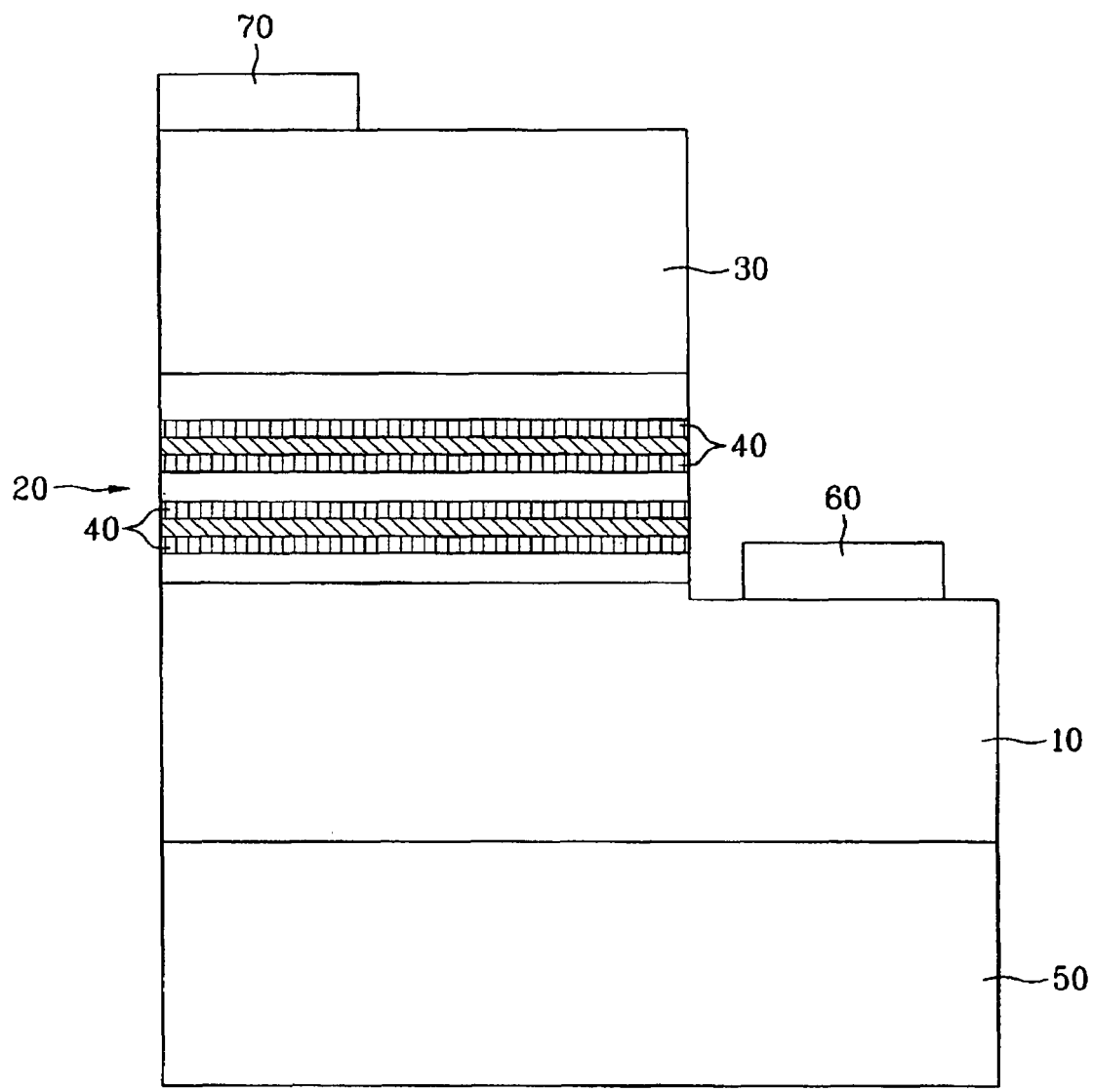
FIG. 7 is a sectional view illustrating an example of a horizontal type light emitting device according to the second embodiment of the present invention.

FIG. 7 illustrates an example of a horizontal type light emitting device including the above-described stress accommodating layers 40. As shown in FIG. 7, the light emitting device includes a substrate 50 and a light emitting structure arranged over the substrate 50. As in the above-described case, the light emitting structure includes an n-type semiconductor layer 10, a light emitting layer 20, and a p-type semiconductor layer 30. FIG. 7 shows a state in which the above-described structure is formed with a p-type electrode 70 and an n-type electrode 60 after being etched such that the n-type semiconductor layer 10 is exposed.

Figure 8:
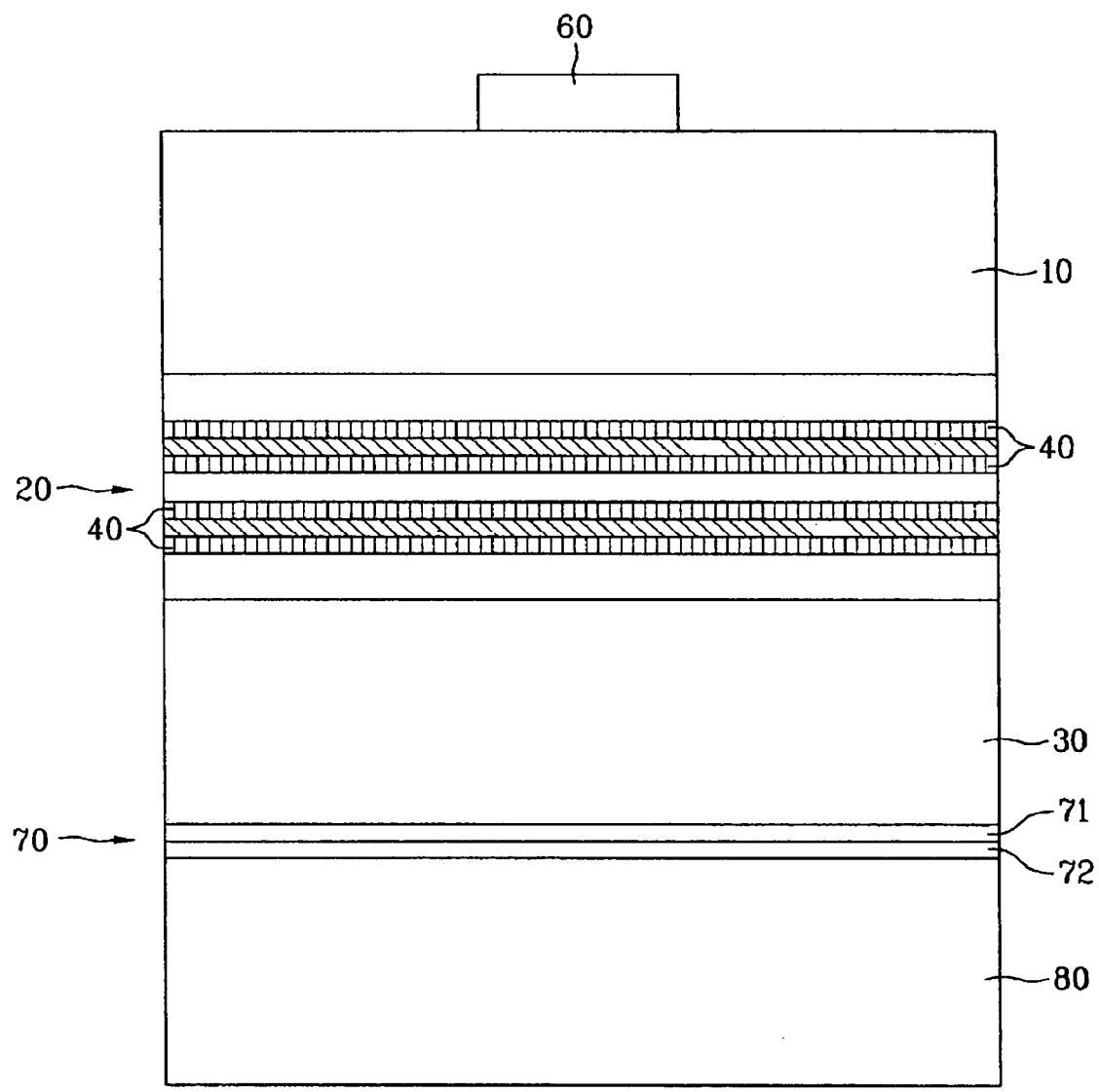
FIG. 8 is a sectional view illustrating an example of a vertical type light emitting device according to the second embodiment of the present invention.

FIG. 8 illustrates an example of a vertical type light emitting device including the above-described stress accommodating layers 40.

As shown in FIG. 8, the light emitting device includes a substrate (not shown) and a light emitting structure arranged over the substrate. As in the above-described case, the light emitting structure includes an n-type semiconductor layer 10, a light emitting layer 20, and a p-type semiconductor layer 30. A support layer 80, which is formed of a metal or conductive semiconductor layer, is arranged on the above-described structure. Under this condition, the substrate is separated from the above-described structure. Thus, the structure of FIG. 8 is obtained.

A p-type electrode 70 is arranged between the p-type semiconductor layer 30 and the support layer 80. The p-type electrode 70 may include an ohmic electrode 71 and a reflection electrode 72. In this case, the ohmic electrode 71 may be a transparent electrode.

The light emitting device manufactured to have the above-described structure can have a greatly-increased light emission efficiency because stress applied to each quantum well layer 21 is accommodated in accordance with the function of the above-described stress accommodating layers 40. Also, it is possible to effectively confine charges in each quantum well layer 21.

Third Embodiment

Figure 9:
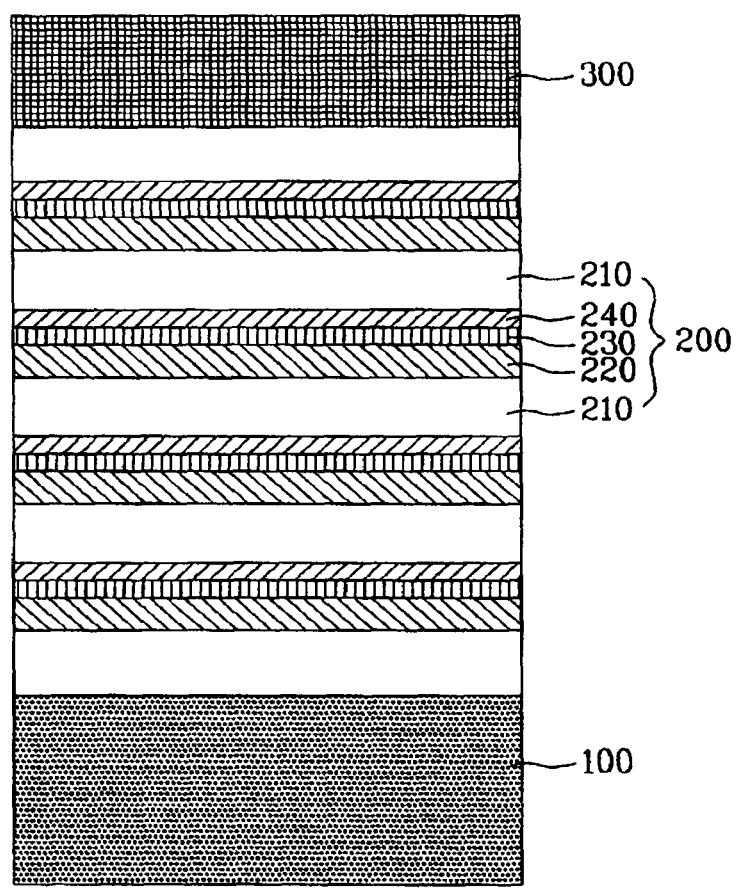
FIG. 9 is a sectional view illustrating a third embodiment of the present invention.

FIG. 9 illustrates a nitride semiconductor light emitting device according to a third embodiment of the present invention. As shown in FIG. 9, the light emitting device includes an n-type electron injection layer 100 and a light emitting layer 200 formed over the n-type electron injection layer 100. The light emitting layer 200 includes a quantum well structure including a first quantum barrier layer 210, a stress accommodating layer 220, a second quantum barrier layer 230, a quantum well layer 240, and another first quantum barrier layer 210. The light emitting layer 200 may include a multi-quantum well structure formed by repeatedly laminating the above-described quantum well structure at least two times.

A p-type hole injection layer 300 is formed over the light emitting layer 200. Accordingly, in the light emitting layer 200, electrons and holes injected from the electron injection layer 100 and hole injection layer 300 are coupled, thereby emitting light.

In order to effectively accommodate stress present in the light emitting layer 200, which has the above-described quantum well structure, the stress accommodating layer 220 may have an in-plane lattice constant ranging between the in-plane lattice constant of the first quantum barrier layer 210 and the in-plane lattice constant of the quantum well layer 240.

Figure 10:
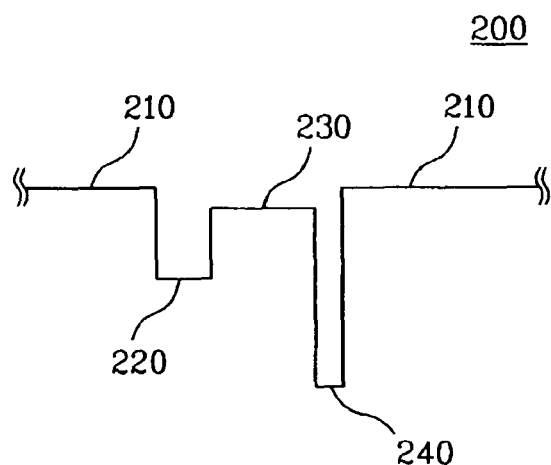
FIG. 10 is an energy band diagram of the third embodiment of the present invention.

Also, in order to effectively inject electrons and holes into the quantum well, the stress accommodating layer 220 may have an energy band gap ranging between the energy band gap of the first quantum barrier layer 210 and the energy band gap of the quantum well layer 240, as shown in FIG. 10.

If necessary, the stress accommodating layer 220 may comprises a super-lattice layer.

Meanwhile, the stress accommodating layer 220 may perform a quantum mechanical function. That is, electrons injected from the n-type electron injection layer 100 can be effectively collected and confined in the stress accommodating layer 220 because the second quantum barrier layer 230 is arranged between the stress accommodating layer 220 and the quantum well layer 240. As a result, the electrons confined in the stress accommodating layer 220 can be effectively injected into the quantum well layer 240.

Taking into consideration such a quantum mechanical function, it is preferred that the thickness of the stress accommodating layer 220 be 1 to 15 nm.

Also, in order to enable the stress accommodating layer 220 to effectively accommodate stress caused by lattice mismatch between the first quantum barrier layer 210 and the quantum well layer 240, it is preferred that the thickness of the second quantum barrier layer 230 be smaller than the thickness of the first quantum barrier layer 210.

The second quantum barrier layer 230 may have a thickness of 0.2 to 5 nm. In this case, the second quantum barrier layer 230 may have an energy band gap higher than that of the stress accommodating layer 220. In this case, the second quantum barrier layer 230 can function to effectively quantum-mechanically confine electrons and holes in the quantum well layer 240, and thus to increase the light emission coupling probability.

One or more of the stress accommodating layers 220 in the light emitting layer 200, which has the above-described MQW structure, may be doped with an n-type dopant, in order to achieve an enhancement in the coupling efficiency for electrons and holes.

The stress accommodating layers 220, and first and second quantum barrier layers 210 and 230 included in the light emitting layer 200, which has the above-described MQW structure, remarkably reduce compressive stress inevitably present in the quantum well layers, and effectively confine electrons and holes in the quantum well layers 240. Accordingly, it is possible to remarkably enhance the internal quantum efficiency of the light emitting device.

That is, the stress accommodating layers 220 effectively accommodate compressive stress generated due to the lattice constant mismatch between the quantum barrier layers 210 and 230 and the quantum well layers 240, thereby achieving a more uniform stress distribution and a more uniform indium distribution in the quantum well layers 240. Thus, it is possible to further enhance optical characteristics.

In addition, the characteristics of the interfaces between the quantum barrier layers 210 and 230 and the quantum well layers 240 are enhanced, thereby reducing the loss of carriers at the interfaces. As a result, a great enhancement in light emission efficiency is achieved.

Thus, it is possible to realize a light emitting device having a high brightness and a high efficiency in accordance with a remarkable enhancement in the intrinsic optical characteristics of the light emitting device, namely, the internal quantum efficiency.

Fourth Embodiment

Figure 11:
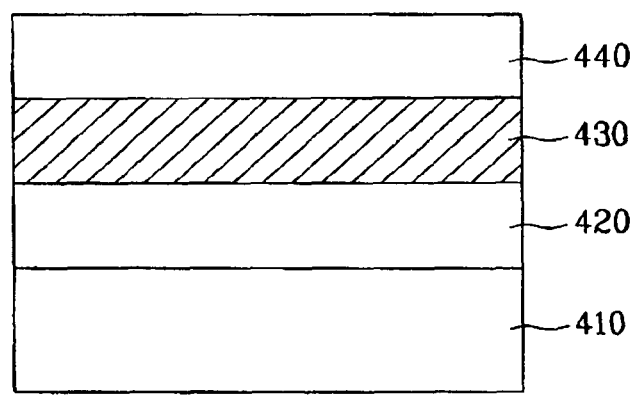
FIG. 11 is a sectional view illustrating a fourth embodiment of the present invention.

FIG. 11 illustrates a nitride semiconductor light emitting device according to a fourth embodiment of the present invention. In accordance with this embodiment, a metal organic chemical vapor deposition (MOCVD) system was used for the growth of a nitride semiconductor thin film. A sapphire substrate was used for a substrate 410.

Ammonia was used for a nitrogen source. For a carrier gas, hydrogen and nitrogen were used. For an organic metal source, gallium, indium, and aluminum were used. Silicon (Si) was used for an n-type dopant, whereas magnesium (Mg) was used for a p-type dopant. An n-type gallium nitride (GaN) semiconductor electron injection layer 420 was grown over the sapphire substrate to a thickness of 4 µm at 1,050° C. At this time, a pressure of 200 Torr was used.

Figure 12:
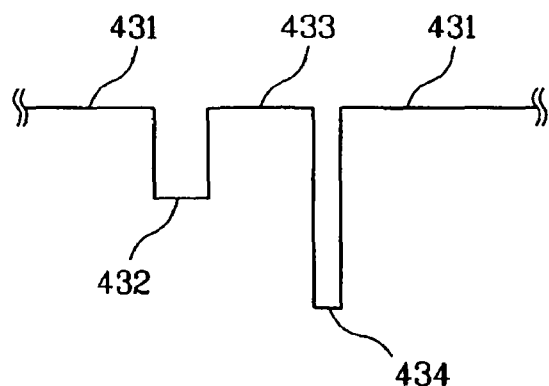
FIG. 12 is an energy band diagram of the fourth embodiment of the present invention.

Over the electron injection layer 420, a light emitting layer 430 having a quantum well band structure shown in FIG. 12 was grown. That is, a first quantum barrier layer 431 of a gallium nitride (GaN) was grown over the electron injection layer 420 to a thickness of 10 nm at a temperature of 850° C. Thereafter, a stress accommodating layer 432 of an indium gallium nitride (InGaN) was grown over the first quantum barrier layer 431 to a thickness of 3 nm. At this time, the amount of the indium source and the growth temperature were controlled such that the average indium content of the InGaN stress accommodating layer 432 is about 3%.

Over the stress accommodating layer 432, a second quantum barrier layer 433 of GaN was grown to a thickness of 1 nm. Thereafter, an InGaN quantum well layer 434 having a thickness of 2.5 nm was grown over the second quantum barrier layer 433 at a temperature of 700° C. At this time, the amount of the indium source was controlled such that the indium content of the InGaN quantum well layer 434 is about 22%.

The above procedure was repeated to grow the light emitting layer 430 such that the light emitting layer 430 has an MQW structure including eight quantum well structures each consisting of one first GaN quantum barrier wall 431, one InGaN stress accommodating layer 432, one second GaN quantum barrier wall 433, and one InGaN quantum well layer 434.

A p-type GaN hole injection layer 440 having a thickness of 0.1 µm was grown over the light emitting layer 430 having the above-described MQW structure.

Figure 13:
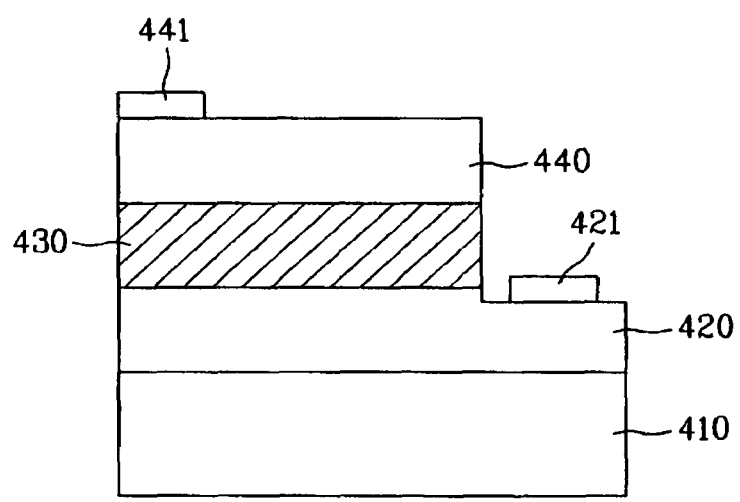
FIG. 13 is a sectional view illustrating an example of a horizontal type light emitting device according to the fourth embodiment of the present invention.

Thereafter, the p-type hole injection layer 440 and light emitting layer 430 were etched, using an etching machine, such that the n-type electron injection layer 420 is partially exposed, as shown in FIG. 13. In this state, an n-type electrode 421 was formed. Also, a p-type electrode 441 was formed on the p-type hole injection layer 440, for the injection of holes. Thus, a horizontal type light emitting device structure was completely manufactured.

Fifth Embodiment

Figure 14:
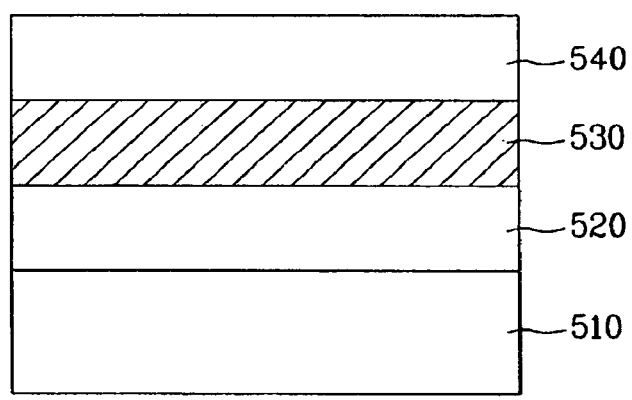
FIG. 14 is a sectional view illustrating a fifth embodiment of the present invention.

In accordance with a fifth embodiment of the present invention, as shown in FIG. 14, an n-type nitride semiconductor electron injection layer 520 was grown over a sapphire substrate 510 to a thickness of 4 µm at 1,050° C. At this time, a pressure of 200 Torr was used.

Figure 15:
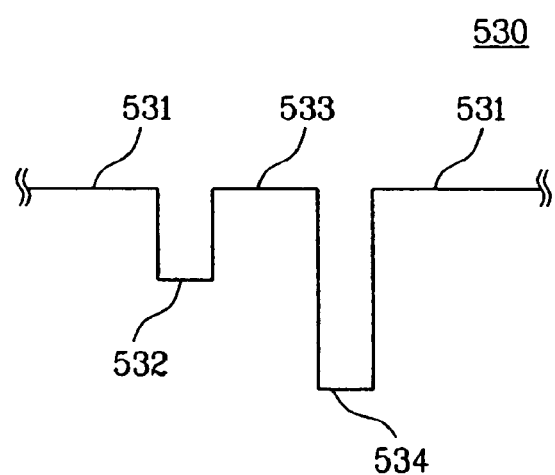
FIG. 15 is an energy band diagram of the fifth embodiment of the present invention.

Over the electron injection layer 520, a light emitting layer 530 having a quantum well band structure shown in FIG. 15 was grown. That is, a first GaN quantum barrier layer 531 was grown over the electron injection layer 520 to a thickness of 10 nm at a temperature of 850° C. Thereafter, an InGaN stress accommodating layer 532 was grown over the first quantum barrier layer 531 to a thickness of 3 nm.

An n-type dopant source was injected during the growth of the stress accommodating layer 532. At this time, the amount of the indium source and the growth temperature were controlled such that the average indium content of the InGaN stress accommodating layer 532 is about 0.1 to 5%.

Over the stress accommodating layer 532, a second GaN quantum barrier layer 533 was grown to a thickness of 0.2 to 3 nm. Thereafter, an InGaN quantum well layer 534 having a thickness of 2.5 nm was grown over the second quantum barrier layer 533 at a temperature of 700° C. At this time, the amount of the indium source was controlled such that the indium content of the InGaN quantum well layer 534 is about 22%.

The above procedure was repeated to grow the light emitting layer 530 such that the light emitting layer 530 has an MQW structure including eight quantum well structures each consisting of one first GaN quantum barrier wall 531, one InGaN stress accommodating layer 532, one second GaN quantum barrier wall 533, and one InGaN quantum well layer 534.

A p-type GaN hole injection layer 540 having a thickness of 0.1 µm was grown over the light emitting layer 530 having the above-described MQW structure.

Subsequent procedures for manufacturing a horizontal type light emitting device structure may be identical to those of the fourth embodiment.

Figure 16:
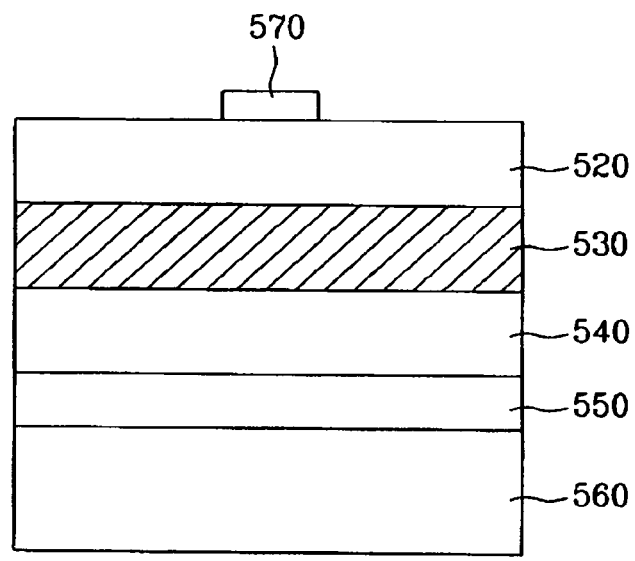
FIG. 16 is a sectional view illustrating an example of a vertical type light emitting device according to the fifth embodiment of the present invention.

If necessary, a vertical type light emitting device structure shown in FIG. 16 may be manufactured. In this case, an ohmic electrode or reflective ohmic electrode 550 is formed on the p-type hole injection layer 540, and a support layer 560 made of a semiconductor or metal is formed over the ohmic electrode 550.

Thereafter, the substrate 510 is removed. An n-type electrode 570 is then formed on the exposed electron injection layer 520. Thus, the vertical type light emitting device structure shown in FIG. 16 is completely manufactured.

Sixth Embodiment

Figure 17:
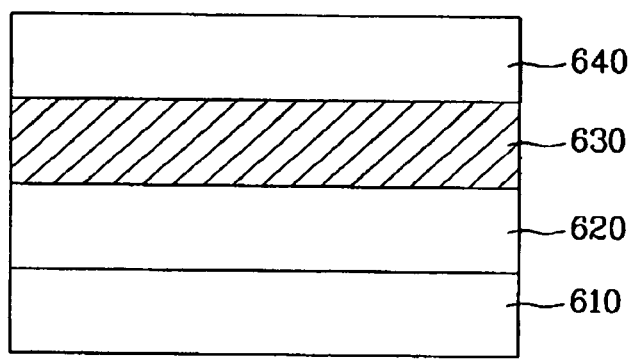
FIG. 17 is a sectional view illustrating a sixth embodiment of the present invention.

In accordance with a sixth embodiment of the present invention, as shown in FIG. 17, an n-type nitride semiconductor electron injection layer 620 was grown over a sapphire substrate 610 to a thickness of 4 µm at 1,050° C. At this time, a pressure of 200 Torr was used.

Over the electron injection layer 620, a light emitting layer 630 having the following structure was grown. That is, a first InGaN quantum barrier layer was grown over the electron injection layer 620 to a thickness of 10 nm at a temperature of 850° C. At this time, the amount of the indium source was controlled such that the indium content of the first quantum barrier layer is about 0.3%, and the controlled indium source amount was injected into a growing machine.

Thereafter, an InGaN stress accommodating layer was grown over the first quantum barrier layer to a thickness of 1 to 7 nm. At this time, the amount of the indium source and the growth temperature were controlled such that the average indium content of the InGaN stress accommodating layer is about 1 to 5%.

Over the stress accommodating layer, a second InGaN quantum barrier layer was grown to a thickness of 0.2 to 3 nm. At this time, the amount of the indium source was controlled such that the indium content of the second InGaN quantum barrier layer is about 0.3%.

Thereafter, an InGaN quantum well layer having a thickness of 2 to 3 nm was grown over the second quantum barrier layer at a temperature of 700° C. At this time, the amount of the indium source was controlled such that the indium content of the InGaN quantum well layer is about 16 to 25%.

The above procedure was repeated to grow the light emitting layer 630 such that the light emitting layer 630 has an MQW structure including eight quantum well structures each consisting of one first quantum barrier wall, one stress accommodating layer, one second quantum barrier wall, and one quantum well layer.

Meanwhile, an n-type dopant source was injected into two to six earlier ones of the eight stress accommodating layers in the light emitting layer 630.

The n-type dopant source was also injected into two to four earlier ones of the first quantum barrier wall layers in the light emitting layer 630.

A p-type GaN hole injection layer 640 having a thickness of 0.1 μm was grown over the light emitting layer 630 having the above-described nitride semiconductor MQW structure.

Subsequently, a horizontal type light emitting device structure as in the fourth embodiment or a vertical type light emitting device structure as in the fifth embodiment may be manufactured.

Seventh Embodiment

Figure 18:
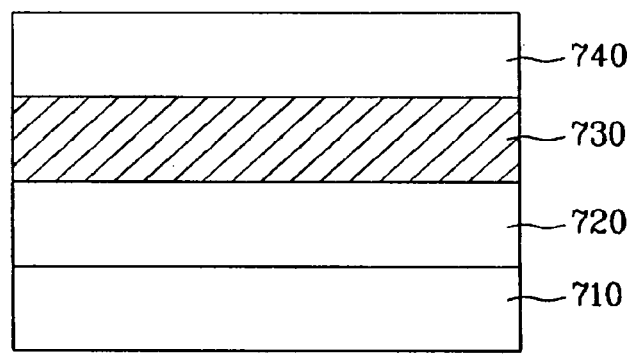
FIG. 18 is a sectional view illustrating a seventh embodiment of the present invention.

In accordance with a seventh embodiment of the present invention, as shown in FIG. 18, an n-type nitride semiconductor electron injection layer 720 was grown over a sapphire substrate 710 to a thickness of 4 μm at 1,050° C. At this time, a pressure of 200 Torr was used.

Over the electron injection layer 720, a light emitting layer 730 having the following structure was grown. That is, a first InGaN quantum barrier layer was grown over the electron injection layer 720 to a thickness of 10 nm at a temperature of 850° C. Thereafter, an InGaN stress accommodating layer was grown over the first quantum barrier layer to a thickness of 3 nm. At this time, the amount of the indium source and the growth temperature were controlled such that the average indium content of the InGaN stress accommodating layer is about 3%.

Over the stress accommodating layer, a second InGaN quantum barrier layer was grown to a thickness of 1 nm. Thereafter, an InGaN quantum well layer having a thickness of 3 nm was grown over the second quantum barrier layer at a temperature of 760° C. At this time, the amount of the indium source was controlled such that the indium content of the InGaN quantum well layer is about 16%.

The above procedure was repeated to grow the light emitting layer 730 such that the light emitting layer 730 has an MQW structure including eight quantum well structures each consisting of one first quantum barrier wall, one stress accommodating layer, one second quantum barrier wall, and one quantum well layer. An n-type dopant source was injected into two earlier ones of the eight stress accommodating layers in the light emitting layer 730.

The n-type dopant source was also injected into four earlier ones of the first quantum barrier wall layers in the light emitting layer 730. Also, the n-type dopant source was injected into the first to fourth earlier ones of the first quantum well layers in the light emitting layer 730.

A p-type GaN hole injection layer 740 having a thickness of 0.1 μm was grown over the light emitting layer 730 having the above-described nitride semiconductor MQW structure.

Subsequently, a horizontal type light emitting device structure as in the fourth embodiment or a vertical type light emitting device structure as in the fifth embodiment may be manufactured.

Eighth Embodiment

Figure 19:
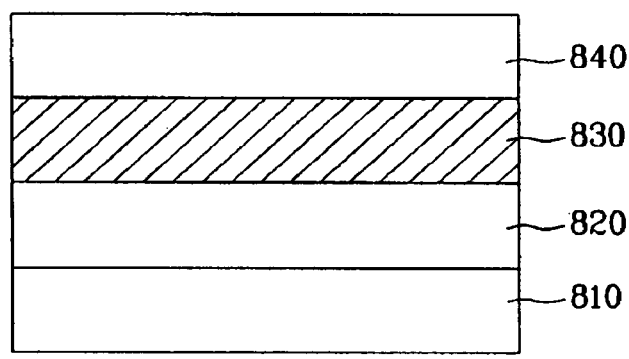
FIG. 19 is a sectional view illustrating an eighth embodiment of the present invention.

In accordance with an eighth embodiment of the present invention, as shown in FIG. 19, an n-type nitride semiconductor electron injection layer 820 was grown over a sapphire substrate 810 to a thickness of 4 μm at 1,050° C. At this time, a pressure of 200 Torr was used.

Figure 20:
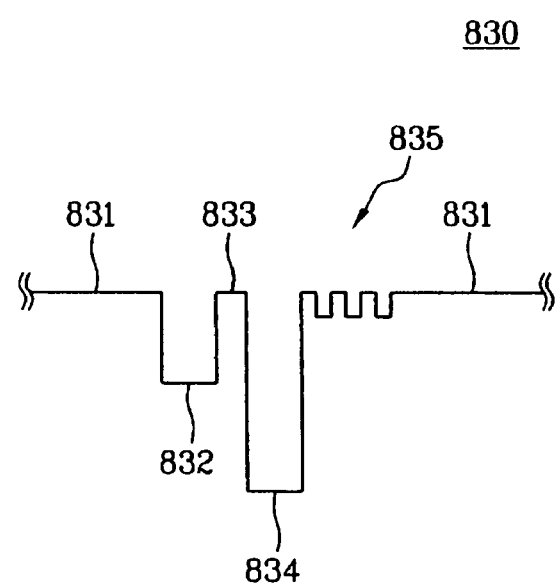
FIG. 20 is an energy band diagram of the eighth embodiment of the present invention.

Over the electron injection layer 820, a light emitting layer 830 having a structure shown in FIG. 20 was grown. That is, a first GaN quantum barrier layer 831 was grown over the electron injection layer 820 to a thickness of about 7 nm at a temperature of 900° C. Thereafter, a first InGaN stress accommodating layer 832 was grown over the first quantum barrier layer 831 to a thickness of 3 nm.

At this time, the amount of the indium source and the growth temperature were controlled such that the average indium content of the first stress accommodating layer 832 is about 2%. Over the first stress accommodating layer 832, a second InGaN quantum barrier layer 833 was grown to a thickness of 1 nm.

Thereafter, an InGaN quantum well layer having a thickness of 3 nm was grown over the second quantum barrier layer 833 at a temperature of 710° C.

A second stress accommodating layer 835 may be grown over the quantum well layer 834. In this case, the first quantum barrier layer 831, which has a thickness of 7 nm, is arranged on the second stress accommodating layer 835.

The second stress accommodating layer 835 may be formed to have the following structure. That is, a GaN layer having a thickness of about 0.5 nm is grown at a temperature of 900° C., and an InGaN layer (having an indium content of about 0.2%) is successively grown over the GaN layer to a thickness of about 0.5 nm.

The second stress accommodating layer 835 may have a super-lattice structure including 2 to 10 deposited structures each consisting of the GaN layer and the InGaN layer having an indium content of about 0.2%.

Meanwhile, the amount of the indium source was controlled such that the indium content of the quantum well layer 834 is about 23%. The above procedure was repeated to grow the light emitting layer 830 such that the light emitting layer 830 has an MQW structure including eight quantum well structures.

An n-type dopant source was injected into two earlier ones of the eight first stress accommodating layers 832 in the light emitting layer 830. The n-type dopant source was also injected into four earlier ones of the first quantum barrier walls 831 in the light emitting layer 830.

Also, the n-type dopant source was injected into two earlier ones of the quantum well layers 834 in the light emitting layer 830 during the growth of the associated quantum well layers 834.

A p-type GaN hole injection layer 840 having a thickness of 0.1 μm was grown over the light emitting layer 830 having the above-described nitride semiconductor MQW structure.

Subsequently, a horizontal type light emitting device structure as in the fourth embodiment or a vertical type light emitting device structure as in the fifth embodiment may be manufactured.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A nitride-based light emitting device comprising:
   a first-type nitride-based layer having a first conductivity;
   a second-type nitride-based layer on the first-type nitride-based layer, the second-type nitride-based layer having a second conductivity;
   a light emitting layer arranged between the first-type nitride-based layer and the second-type nitride-based layer, the light emitting layer comprising:
   a plurality of quantum barrier layers;
   a quantum well layer disposed between adjacent quantum barrier layers; and
   a nitride-based layer arranged on at least one surface of the quantum well layer, wherein the nitride-based layer comprises a first layer and a second layer having different lattice constants; and
   a first electrode electrically connected to the first-type nitride-based layer; and
   a second electrode electrically connected to the second-type nitride-based layer.

2. The device according to claim 1, wherein the composition of the quantum well layer and nitride-based layer are different.

3. The device according to claim 1, wherein the first layer has a different indium composition from the second layer of the nitride-based layer.

4. A nitride-based light emitting device comprising:
   a first-type nitride-based layer having a first conductivity;
   a second-type nitride-based layer on the first-type nitride-based layer, the second-type nitride-based layer having a second conductivity;
   a light emitting layer arranged between the first-type nitride-based layer and the second-type nitride-based layer, the light emitting layer comprising:
   a plurality of first quantum barrier layers;
   a quantum well layer and a nitride-based layer arranged between the adjacent first quantum barrier layers, wherein the composition of the quantum well layer and the nitride-based layer are different; and
   a second quantum barrier layer between the quantum well layer and the nitride-based layer, wherein the light emitting layer comprises a repeated structure in an order of the first quantum barrier layer, the nitride-based layer, the second quantum barrier layer, and the quantum well layer;
   a first electrode electrically connected to the first-type nitride-based layer; and
   a second electrode electrically connected to the second-type nitride-based layer.

5. The device according to claim 4, wherein the second quantum barrier layer has a different energy band gap from the plurality of first quantum barrier layers.

6. The device according to claim 4, wherein at least one of the plurality of first quantum barrier layers and the second quantum barrier layer contacts the quantum well layer.

7. The device according to claim 4, wherein at least one of the nitride-based layer, the quantum well layer, the plurality of first quantum barrier layers, and the second quantum barrier layer contains an n-type dopant.

8. The device according to claim 1, wherein the nitride-based layer contacts one of the plurality of quantum barrier layers.

9. The device according to claim 1, wherein the nitride-based layer accommodates a stress acting on the quantum well layer.

10. The device according to claim 1, wherein the nitride-based layer has an average in-plane lattice constant that ranges between a lattice constant of the quantum well layer and a lattice constant of the plurality of quantum barrier layers.

11. The device according to claim 1, wherein the first layer of the nitride-based layer has an energy band gap larger than an energy band gap of each of the plurality of quantum barrier layers, and the second layer of the nitride-based layer has an energy band gap that ranges between an energy band gap of the quantum well layer and an energy band gap of each of the plurality of quantum barrier layers.

12. The device according to claim 1, wherein the first layer and the second layer of the nitride-based layer are arranged alternatively.

13. The device according to claim 1, wherein the first layer or the second layer has a thickness corresponding to 1 to 10 mono-layers.

14. The device according to claim 1, wherein the first layer comprises GaN and the second layer comprises InGaN or AlInGaN.

15. The device according to claim 1, wherein the quantum well layer comprises InGaN having an indium composition expressed by "x" in $In_xGa_{1-x}N$, "x" is 0.2 to 0.4 ($0.2 \leq x \leq 0.4$).

16. The device according to claim 4, wherein the nitride-based layer has a thickness of 1 to 15 nm.

17. The device according to claim 4, wherein the light emitting layer further comprises a second nitride-based layer arranged on the quantum well layer.

18. The device according to claim 1, wherein the first-type nitride-based layer is arranged on a support layer.

19. The device according to claim 18, wherein the support layer comprises a metal or a conductive semiconductor layer.

20. The device according to claim 18, wherein the first electrode is located between the support layer and the first-type nitride-based layer.

21. The device according to claim 18, wherein the first electrode comprises a reflection electrode.

22. The device according to claim 17, wherein the second nitride-based layer comprises a super lattice structure comprising a third layer and a forth layer deposited alternatively.

23. The device according to claim 1, wherein the quantum well layer and the nitride-based layer comprise at least one of Al and In composition.

* * * * *